United States Patent
Shih et al.

(10) Patent No.: US 9,081,288 B2
(45) Date of Patent: Jul. 14, 2015

(54) EXTREME ULTRAVIOLET (EUV) MASK, METHOD OF FABRICATING THE EUV MASK AND METHOD OF INSPECTING THE EUV MASK

(71) Applicant: Taiwan Semiconductor Manufacturing Co., LTD., Hsinchu (TW)

(72) Inventors: Chih-Tsung Shih, Hsinchu (TW); Yen-Cheng Lu, New Taipei (TW); Shinn-Sheng Yu, Hsinchu (TW); Jeng-Horng Chen, Hsin-Chu (TW); Anthony Yen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 203 days.

(21) Appl. No.: 13/955,164

(22) Filed: Jul. 31, 2013

(65) Prior Publication Data

US 2015/0037712 A1     Feb. 5, 2015

(51) Int. Cl.
*G03F 1/24*     (2012.01)
*G03F 1/84*     (2012.01)
*G03F 1/22*     (2012.01)

(52) U.S. Cl.
CPC ... *G03F 1/22* (2013.01); *G03F 1/84* (2013.01)

(58) Field of Classification Search
CPC .................................. G03F 1/22; G03F 1/84
USPC ......................................................... 430/5
See application file for complete search history.

(56) References Cited

U.S. PATENT DOCUMENTS

2004/0175630 A1* 9/2004 Wasson et al. ............... 430/5

* cited by examiner

*Primary Examiner* — Stephen Rosasco
(74) *Attorney, Agent, or Firm* — Maschoff Brennan

(57) ABSTRACT

An out-of-band (OoB) suppression layer is applied on a reflective multiplayer (ML) coating, so as to avoid the OoB reflection and to enhance the optical contrast at 13.5 nm. A material having a low reflectivity at wavelength of 193-257 nm, for example, silicon carbide (SiC), is used as the OoB suppression layer. A method of fabricating an EUV mask having the OoB suppression layer and a method of inspecting an EUV mask having the OoB suppression are also provided.

20 Claims, 7 Drawing Sheets

EXTREME ULTRAVIOLET (EUV) MASK, METHOD OF FABRICATING THE EUV MASK AND METHOD OF INSPECTING THE EUV MASK

BACKGROUND

In the manufacture of integrated circuits (IC), patterns representing different layers of the IC are fabricated using a series of reusable photomasks ("masks") to transfer the design of each layer of the IC onto a semiconductor substrate during the manufacturing process in a photolithography process. These layers are built up using a sequence of processes and resulted in transistors and electrical circuits. However, as the IC sizes continue to shrink, meeting accuracy requirements as well as reliability in multiple layer fabrication has become increasingly more difficult.

Photolithography uses an imaging system that directs radiation onto the photomask and then projects a shrunken image of the photomask onto a semiconductor wafer covered with photoresist. The radiation used in the photolithography may be at any suitable wavelength, with the resolution of the system increasing with decreasing wavelength. Deep ultraviolet (DUV) light with a radiation at a wavelength of 248 or 193 nanometers (nm) has been widely used for exposure through a transmissive mask. However, with the shrinkage in IC size, extreme ultraviolet (EUV) lithography with a typical wavelength of 13.5 nm becomes one of the leading technologies for 16 nm and smaller node device patterning.

An EUV mask utilized for the EUV lithography is a layered structure including a Bragg mirror deposited on a substrate. On the substrate, a reflective multilayer stack, which is formed by sequentially stacking materials having different optical properties, is used to achieve a high EUV light reflectance. The pattern is formed from absorptive features or lines etched into the EUV mask. The reflective multiplayer stack is a type of Bragg reflector that reflects light at a selected wavelength through constructive interference. The thicknesses of the alternating layers are tuned to maximize the constructive interference (Bragg reflection) of the EUV light reflected at each interface and to minimize the overall absorption of the EUV light. The multiplayer coating can achieve about 60 to 75% reflectivity at the peak radiation wavelength. The EUV Lithography process may lack spectral purity for its light sources, meaning the light sources may produce undesirable out-of-band (OoB) radiation, i.e., radiation of an undesirable bandwidth, for example, between 193 nanometers (nm) to 257 nm. Existing photoresist materials may be sensitive to the OoB radiation and may absorb such radiation. This would result in reduced contrast and hence degradation of imaging performance.

On the other hand, the EUV masks require frequent cleaning to reduce or eliminate defects during the optical lithography operation. The cleaning is typically performed at an elevated temperature to enable and/or enhance the efficiency of the cleaning chemistry. In addition, during use the masks are inadvertently heated through exposure with extreme ultraviolet light. In this regard, the mask is frequently exposed to temperatures above ambient during the masks lifecycle and is used at temperatures exceeding ambient during normal operation. Consequently, these conditions can cause several types of chemical diffusion and chemical reactions within the multilayer stack of the Bragg mirror.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
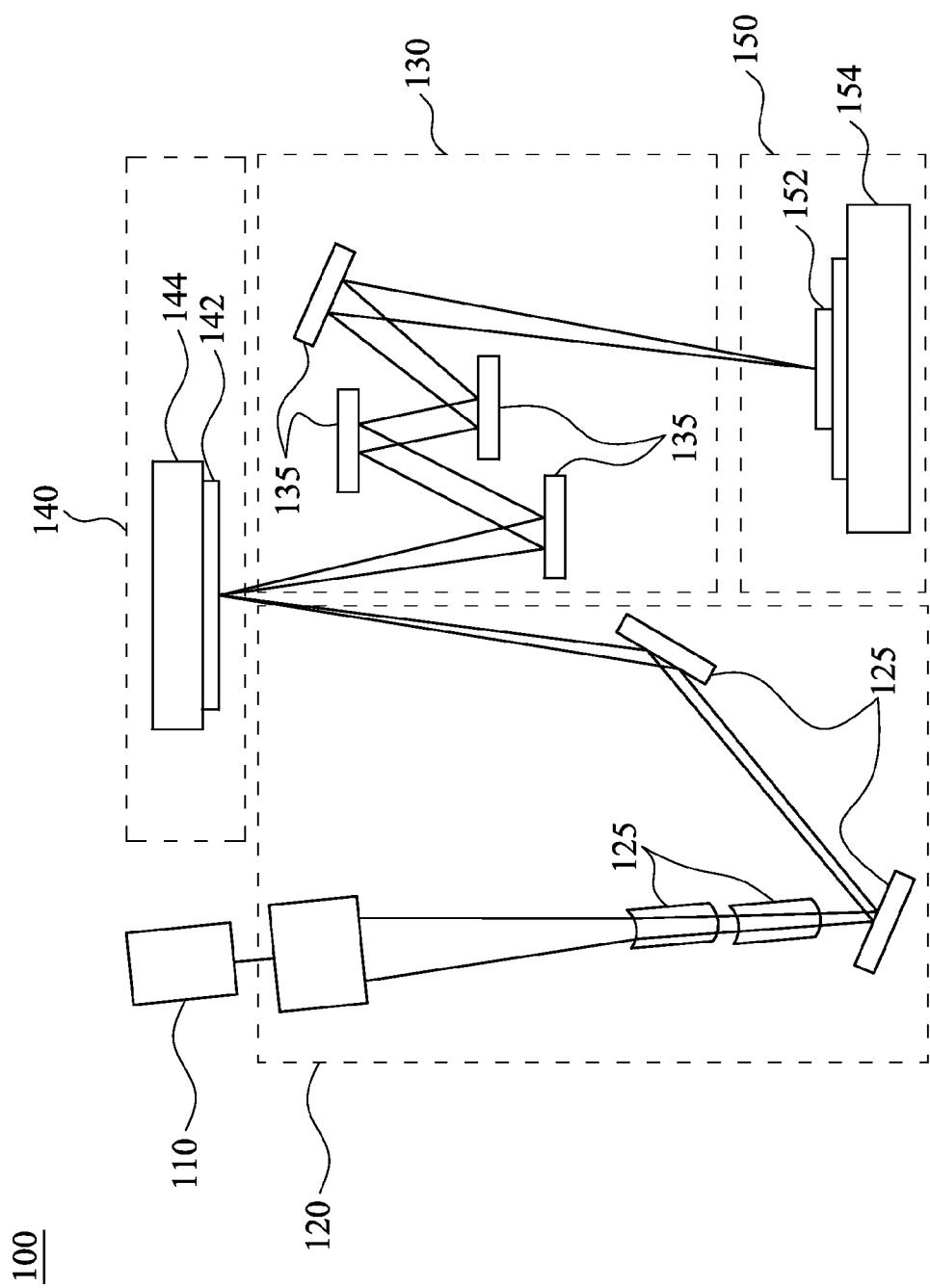
FIG. 1 is a block diagram of a photolithography imaging system that uses a mask in processing a wafer.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a gate stack includes embodiments having two or more such gate stacks, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

The EUV lithography is an exposure technique using EUV light. The EUV light refers a ray having a wavelength in a soft X-ray region or a vacuum ultraviolet ray region. Specifically, the EUV light has a wavelength of about 10 to 20 nm, particularly about 13.5 nm±0.3 nm. In the EUV lithography, illumination is cast on the EUV mask at an angle, e.g., 5° relative to the axis perpendicular to a plane of the mask. Challenges exist in an optics system of the EUV lithography for transferring a pattern to the wafer, including the optics deformation, contamination, source stability, dose uniformity, shot noise, flare (stray lights), optical contrast, etc.

As to the optical contrast of the pattern formed from the EUV mask at 13.5 nm, the reflective multiplayer stack also reflects radiation of bandwidths that are out of a desired bandwidth of the EUV band. For example, radiation having a bandwidth in a range between about 193-247 nm is considered undesirable Out-of-Band (OoB) radiation for EUV lithography processes. The OoB radiation is included in light generated from a light source of EUV exposure apparatus. As a result, the absorption of such OoB radiation results in reduced optical contrast and degradation of imaging performance of conventional photoresist materials. Exposure of the EUV photoresist to OoB radiation typically results in unwanted background exposure of the resist called "flare." Flare among other things hurts the resolution of the resist, reducing contrast with respect to unexposed areas, and compromising the ability to etch patterns of sufficiently small sizes.

According to various embodiments of the present disclosure, an OoB suppression layer is applied on a reflective multiplayer (ML) coating, so as to avoid the OoB reflection and thus enhance the optical contrast at 13.5 nm. A material having a low reflectivity at wavelength of 193-257 nm, for example silicon carbide (SiC), is used as the OoB suppression layer. In some embodiments, the OoB suppression layer is a composite layer having two layers, a SiC layer and a Mo layer. According to various embodiments of the present disclosure, a buffer layer made of SiC can be deposited over the reflective ML coating or the OoB suppression layer to enhance the optical contrast at 13.5 nm.

According to various embodiments of the present disclosure, a method of inspecting an EUV mask is provided. In the EUV lithography process, the EUV masks require frequent cleaning to reduce or eliminate defects during the optical lithography operation. In the cleaning process, the mask is frequently exposed to temperatures above ambient during the masks lifecycle and is used at temperatures exceeding ambient during normal operation. Consequently, defects occur within the reflective ML coating and degrade the performance of the EUV mask. In various embodiments of the present disclosure, the EUV mask including the OoB suppression layer also has an improved optical contrast at a radiation of wavelength at 193 nm. Because of the enhanced optical contrast at wavelength at 193 nm, the method according to the various embodiments of the present disclosure provides better detecting efficacy of the defects or particles on the EUV mask during the cleaning process or usage operation. Further, the OoB suppression layer of SiC has a better resistance than the conventional materials (e.g., Si) to attacks of the chemicals used in the EUV lithography process or the cleaning process.

Photolithography uses an imaging system that directs radiation onto a mask having a pattern and then projects a reduced image of that mask onto a semiconductor wafer covered with photoresist. The radiation used in photolithography may be at any suitable wavelength, with the resolution of the system increasing with decreasing wavelength. The ability to print smaller features onto the semiconductor wafer improves as the resolution increases. Concerning EUV lithography, it is based on exposure with the portion of the electromagnetic spectrum having a wavelength of 10-15 nanometers. An EUV step-and-scan tool may have a 4-mirror, 4x-reduction projection system with a 0.10 Numerical Aperture (NA). Exposure is accomplished by stepping fields over a wafer and scanning the EUV mask across each field. Various types of masks used in photolithography include such as binary mask, alternating phase-shift mask, and attenuated phase-shift mask (att-PSM), as well as various hybrid mask types. The EUV mask may be fabricated by exposing and developing the photoresist layer of the blank substrate to form a photoresist pattern and by etching the absorption layer and the buffer layer using the photoresist pattern as an etch mask to form an absorption layer pattern. If the absorption layer pattern is formed to have a critical dimension (CD), for example, of a size that is different from the design CD value, it may be difficult to compensate the CD of the absorption layer pattern. A CD of 50-70 MD may be achieved with a depth of focus (DOF) of about 1 micrometer (um). Alternatively, a 6-mirror, 4X-reduction projection system may be applied with a 0.25 NA to print a smaller CD of 20-30 nm, at the expense of a reduced DOF. Other tool designs with a 5X- or a 6X-reduction projection system may also be used for EUV lithography.

Referring to FIG. 1, an EUV lithography imaging system 100 includes a radiation source 110, a condenser optics section 120, a projection optics section 130, a mask stage 140, and a wafer stage 150. The radiation source 110 may be any source able to produce radiation in the EUV wavelength range. One example of a suitable radiation source 110 is creates a plasma when a laser illuminates a gas, such as a supersonic jet of xenon gas. As another example, a suitable radiation source 110 may be use bending magnets and undulators associated with synchrotrons. As a further example, a suitable radiation source 110 may be use discharge sources, which have the potential to provide adequate power in the desired wavelength range. EUV radiation is strongly absorbed in virtually all transmissive materials, including gases and glasses. To minimize unwanted absorption, EUV imaging is carried out in near vacuum.

The condenser optics section 120 brings the radiation from the source 110 to the mask stage 140. In the EUV lithography imaging system 100, the condenser optics are reflective because EUV radiation is strongly absorbed in traditionally transmissive materials such as lenses, which may be used in traditional photolithography imaging systems. Accordingly, the condenser optics section 120 includes condenser reflectors or mirrors 125 that collect and focus the radiation from the source 110 onto the mask stage 140. Any number of condenser mirrors 125 may be used, such as, for example, the four shown in FIG. 1.

The mask stage 140 includes a transport stage 146 that scans a mask 142. In the EUV lithography imaging system 100, the mask 142 is reflective because EUV radiation is strongly absorbed in most materials such as transmissive photomasks that are used in traditional photolithography imaging systems.

The projection optics section 130 reduces the image from the mask 140 in the mask stage 140 and forms the image onto wafer 152 in the wafer stage 150. In the EUV lithography imaging system 100, the projection optics are reflective because of the absorption associated with EUV radiation. Accordingly, the projection optics section 130 includes reflectors or mirrors 135 that project radiation reflected from the mask 140 onto the wafer. The reflectance spectrum of the mask 142 may be matched to that of the mirrors in the projection optics section 130. The term "projection optics" used herein should be broadly interpreted as encompassing any type of projection system, including refractive, reflective, catadioptric, magnetic, electromagnetic and electrostatic optical systems, or any combination thereof, as appropriate for the exposure radiation being used.

The wafer stage 150 includes a transport stage 156 that scans a semiconductor wafer 152 in synchrony with the mask 142 and steps the wafer 152 into a position to accept a next image from the mask 142. During operation, a semiconductor wafer 152 mounted to the transport stage 156. The projection optics convey the radiation light with a pattern in its cross-section to create a pattern in a target portion of the wafer 152. It should be noted that the pattern conveyed to the radiation light may not exactly correspond to the desired pattern in the target portion of the wafer, for example if the pattern includes phase-shifting features or shadows. Generally, the pattern conveyed to the radiation light will correspond to a particular functional layer in a device being created in a target portion of the wafer 152, such as an IC.

Figure 2:
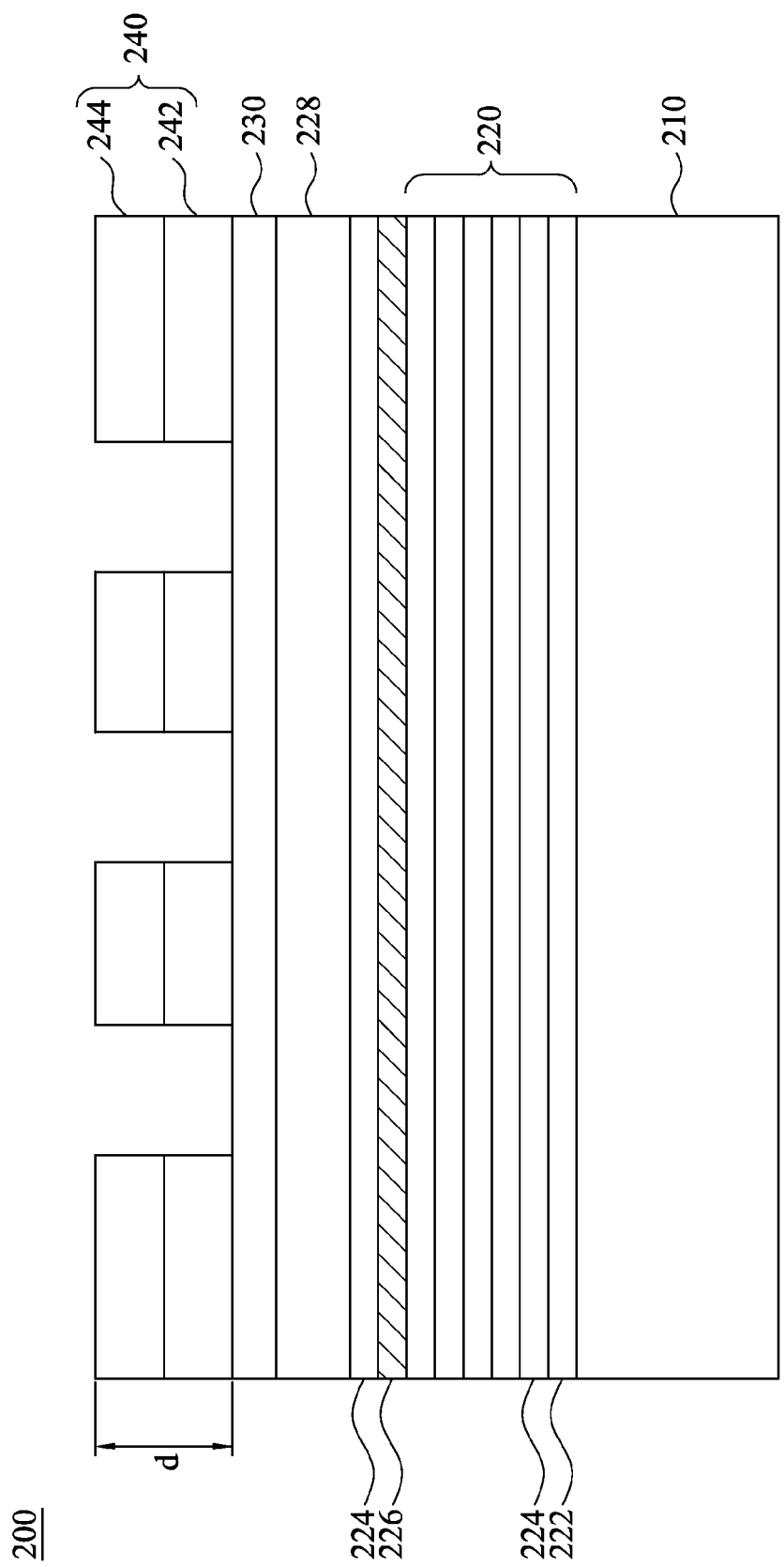
FIG. 2 is a cross-sectional view schematically illustrating an EUV mask according to various embodiments of the present disclosure.

FIG. 2 is a schematic cross-sectional view of an EUV mask 200, having a patterned absorber layer 240 according to various embodiments of the present disclosure. The EUV mask 200 includes a substrate 210, a reflective multilayer (ML) coating 220 for reflecting EUV light, an out-of-band (OoB) layer consisting of a first layer 226 and a second layer 224, and a buffer layer 230. In various embodiments, a capping layer 228 made of SiC may be deposited on the OoB suppression layer 224/226 prior to the forming of the buffer layer 230. In some embodiments, the buffer layer 230 acts as a capping layer, such that the capping layer of 228 is the same layer of the buffer layer 230. According to embodiments of the present disclosure, the patterned absorber layer 240 is a dual layer of consisting of a first layer 242 and a second layer 244.

During the EUV lithography process, up to about 40% of the EUV light is absorbed by the EUV mask. Thermal expansion caused by the heating leads to a large image distortion that may exceed the error tolerance. Low thermal expansion material (LTEM) has been used as the substrate material for the substrate of the EUV masks. The substrate 210 may have a low thermal expansion coefficient (for example, the thermal expansion coefficient within a temperature range of from 19° C. to 27° C. is $0\pm1.0\times10^{-7}/°$ C. In various embodiments, the thermal expansion coefficient is $0\pm0.3\times10^{-7}/°$ C., $0\pm0.2\times10^{-7}/°$ C., $0\pm0.1\times10^{-7}/°$ C., or $0\pm0.05\times10^{-7}/°$ C. A glass having a low thermal expansion coefficient, such as a β quartz may be used as the substrate 210. Further, a film such as a stress correcting film (not shown) may be formed on the substrate 210.

The reflective ML coating 220 of the EUV mask is used to achieve a high EUV light reflectance. The reflective ML coating 220 is a type of Bragg reflector that reflects light at a selected wavelength through constructive interference. The selection of materials in the ML coating 220 depends on the radiation wavelength (λ) to be reflected. Each layer of the ML coating 220 has a thickness of about one quarter of λ. In particular, the thickness of the respective layers of the ML coating 220 depends on the radiation wavelength and the incidence angle of the radiation light. For EUV, the λ is 13.5 nm and the incidence angle is about 5 degrees. Using many reflecting film pairs, over 60% reflectance for light having a wavelength in the vicinity of 13.5 nm is achieved. The thicknesses of the alternating layers are tuned to maximize the constructive interference (Bragg reflection) of the EUV light reflected at each interface and to minimize the overall absorption of the EUV light. The ML coating 220 can achieve about 60-75% reflectivity at the peak radiation wavelength. The reflective ML coating 220 is formed by sequentially stacking materials 222/224 having different optical properties. The Bragg reflection occurs at the interface of the materials 222/224. The reflectivity of the reflective ML coating 220 is proportional to the square of the difference between the refractive indexes (real parts of complex refractive indexes) of the two materials 222/224 that are alternately stacked. In addition, the wavelength and maximum reflectivity of the reflected EUV light are determined based upon the kinds of the materials in 222/224. In various embodiments, the reflective ML coating 220 has 30 pairs to about 60 pairs of alternating layers of a low index of refraction material 224 and a high index of refraction material 222. For example, 40 pairs of the alternative layers 222/224 of the first ML film 320 are deposited in which the high index of refraction material 222 may be formed from about 2.8 nm thick Molybdenum (Mo) while the low index of refraction material 224 may be formed from about 4.1 nm thick Silicon (Si).

According to various embodiments of the present disclosure, the OoB layer consisting of a first layer 226 and a second layer 224 is formed on a top surface of the reflective ML coating 220. The first layer 226 is made of a material having a low reflectivity of the radiation at wavelength of 193-257 nm, and a low refraction index than that of the material for the second layer 224. The term "low'" reflectivity refers to the material having a value of reflectivity to the radiation at 193-257 nm lower than that of materials used in the reflective ML coating 220. In embodiments, the first layer 226 may be made of SiC and the second layer 224 be made of Mo. Accordingly, the EUV mask of FIG. 2 reflects less OoB light and thus improves optical contrast in the EUV region.

A buffer layer 230, such as about 11 nm thick Ruthenium (Ru), may be formed over the top surface of the OoB suppression layer 224/226. in some embodiments, a capping layer 228 made of SiC may be deposited on the OoB suppression layer 224/226 prior to forming the buffer layer 230. The Mo layer in either the reflective ML coating 220 or the OoB suppression layer can become oxidized under ambient conditions. The capping layer 228 of SiC prevents oxidation of the Mo layer. In certain embodiments, the capping layer 228 of SiC may be the buffer layer 230; that is, the buffer layer 230 is the same layer of the capping layer 228 of SiC and acts as the capping layer. In specific embodiments, the capping layer 228 of SiC has a thickness of 2-7 nm, and for example, a thickness of 3 nm.

According to various embodiments of the present disclosure, a patterned absorber layer 240 is formed over the reflective ML coating 220. In various embodiments, the absorber layer 240 has a thickness d in a range of 30-70 nm. In some embodiments, the absorber layer 240 is a dual-layer stack having a first layer 242 and a second layer 244. In various embodiments, more than one dual-layer stack may be deposited over the reflective ML coating 220.

FIGS. 3A-3D are the cross-sectional side views of the EUV mask 200 of FIG. 2A at various stages of manufacture according to various embodiments of the present disclosure. For reasons of simplicity, FIGS. 3A-3D may only illustrate a part of the EUV mask.

Figure 3A:
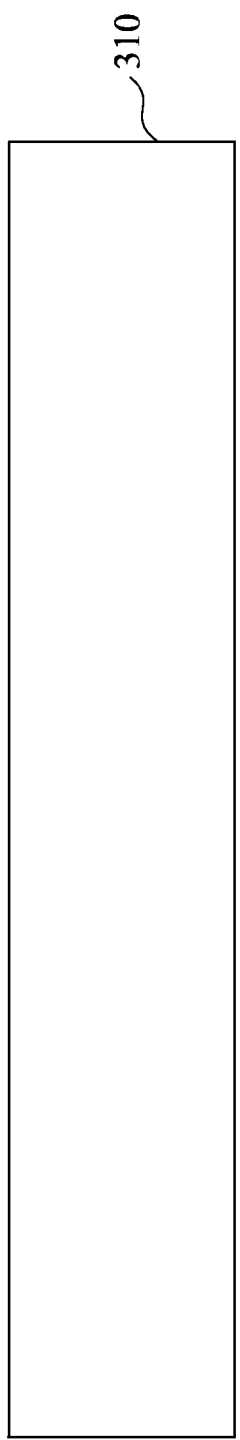
FIG. 3A is a cross-sectional view schematically illustrating mask according to various embodiments of the present disclosure.

In FIG. 3A, a substrate 310 with a low defect level and a smooth surface is used as the starting material for the EUV mask 200 in the present disclosure. The substrate 310 has a low coefficient of thermal expansion (CTE). In some embodiments, the substrate 310 is a glass or glass-ceramic material. For example, the substrate 310 may be formed of β-quartz, Referring to FIG. 3B, a reflective ML coating 320 is formed over the substrate 310. The reflective ML coating 320 has about 30-60 pairs of alternating layers of a low index of refraction material 324 and a high index of refraction material 322. In some embodiments, the reflective ML coating 320 has 40 pairs of the alternative layers 322/324. A high index of refraction material 322 includes elements with high atomic number which tend to scatter EUV light. A low index of refraction material 324 includes elements with low atomic number which tend to transmit EUV light. The reflective ML coating 320 is formed over the substrate 310 by using ion beam deposition (IBD) or DC magnetron sputtering. The thickness uniformity should be better than 0.8% across the substrate 310. IBD results in less perturbation and fewer defects in the upper surface of the reflective ML coating 320 because the deposition conditions can usually be optimized to smooth over any defect on the substrate 310. In various embodiments, 40 pairs of the alternative layers 322/324 of the ML coating 320 are deposited in which the high index of refraction material 322 may be formed from about 3 nm thick Mo while the low index of refraction material 324 may be formed from about 4 nm thick Si. For example, the high index of refraction material 322 may be formed from about 2.8 nm thick Mo while the low index of refraction material 324 may be formed from about 4.1 nm thick Si.

In various embodiments, in fabricating an EUV mask, a substrate 310 may be provided having the reflective ML coating 320 thereon. In this case of the substrate 310 already having the reflective ML coating 320, the operation in FIG. 3B may be omitted in the method of fabricating the EUV mask according to the embodiments of the present disclosure.

Figure 3B:
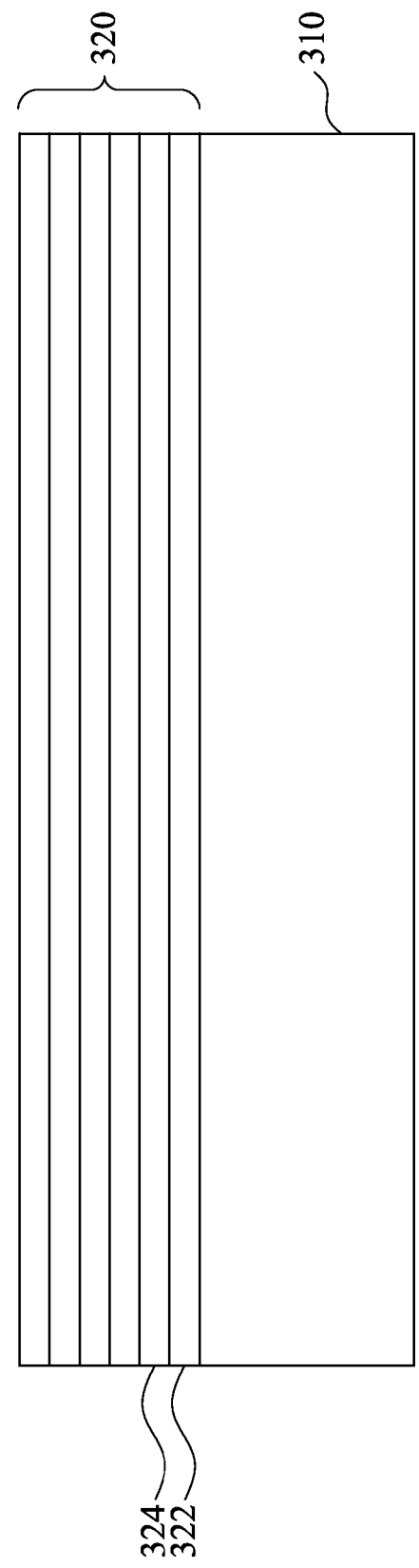
FIG. 3B is a cross-sectional view schematically illustrating an EUV mask according to various embodiments of the present disclosure.
Figure 3C:
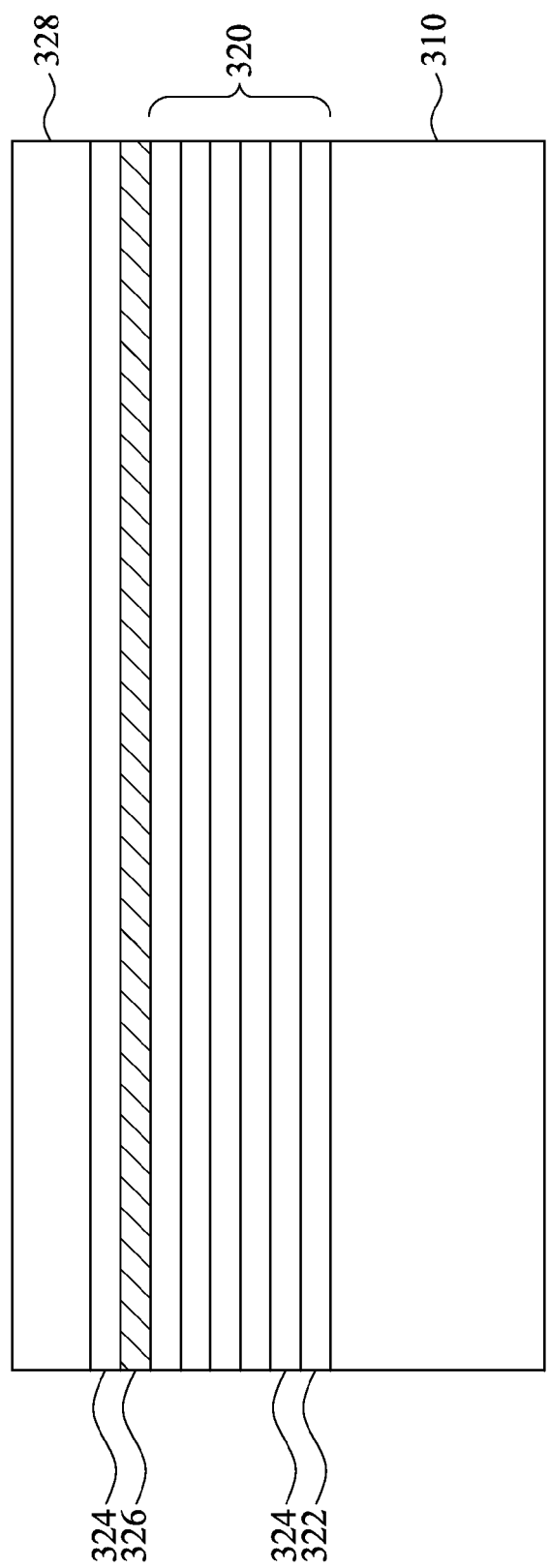
FIG. 3C is a cross-sectional view schematically illustrating an EUV mask according to various embodiments of the present disclosure.

As shown in FIG. 3C, an OoB suppression layer consisting of a first layer 326 and a second layer 324 is deposited on the reflective ML layer 320. The first layer 326 is made of a material having a low reflectivity of the radiation at wavelength of 193-257 nm, and a low refraction index than that of the material for the second layer 324. In embodiments, the first layer 326 may be made of SiC and the second layer 324 be made of Mo. In various embodiments, the first layer 326 and the second layer 324 may be formed by using ion beam deposition (IBD) or DC magnetron sputtering.

In some embodiments, a capping layer 328 made of SiC may be deposited on the OoB suppression layer 324/326. Because the Mo layer in either the reflective ML coating 320 or the OoB suppression. layer can become oxidized under ambient conditions, the capping, layer 328 of SiC prevents oxidation of the Mo layer. In certain embodiments, the capping layer 328 of SiC has a thickness of 2-7 nm, and for example, a thickness of 3 nm. In some embodiments, the capping layer 328 is made of Ruthenium (Ru). In various embodiments, the first layer 326 and the second layer 324 may be formed by using ion beam deposition (IBD) or DC magnetron sputtering The buffer layer 330 is formed over the OoB suppression layer 324/326 or the capping layer 328. The buffer layer 330 may have a thickness of about 20-60 nm. The buffer layer may be formed from silicon dioxide (SiO$_2$) or a silicon (Si) layer, In various embodiments, the buffer layer may a Ru capping layer formed at the top of the ML coating 320 to prevent oxidation of Mo by exposure to the environment. The buffer layer 330 may be low temperature oxide (LTO) as SiO$_2$, or other materials, such as silicon oxynitride (SiOxNy) or carbon (C). The buffer layer 330 may act later as an etch stop layer for patterning of the overlying absorber 340 formed in the following operation. In some embodiments, the capping layer 328 of SiC may be the buffer layer 330; that is, the buffer layer 330 is the same layer of the capping layer 328 of SiC and acts as the capping layer. Furthermore, the buffer layer 330 may also serve later as a sacrificial layer for focused ion beam (FIB) repair of defects in the absorber 340. The buffer layer 330 may be deposited by a suitable process such as magnetron sputtering and ion beam sputtering.

Figure 3D:
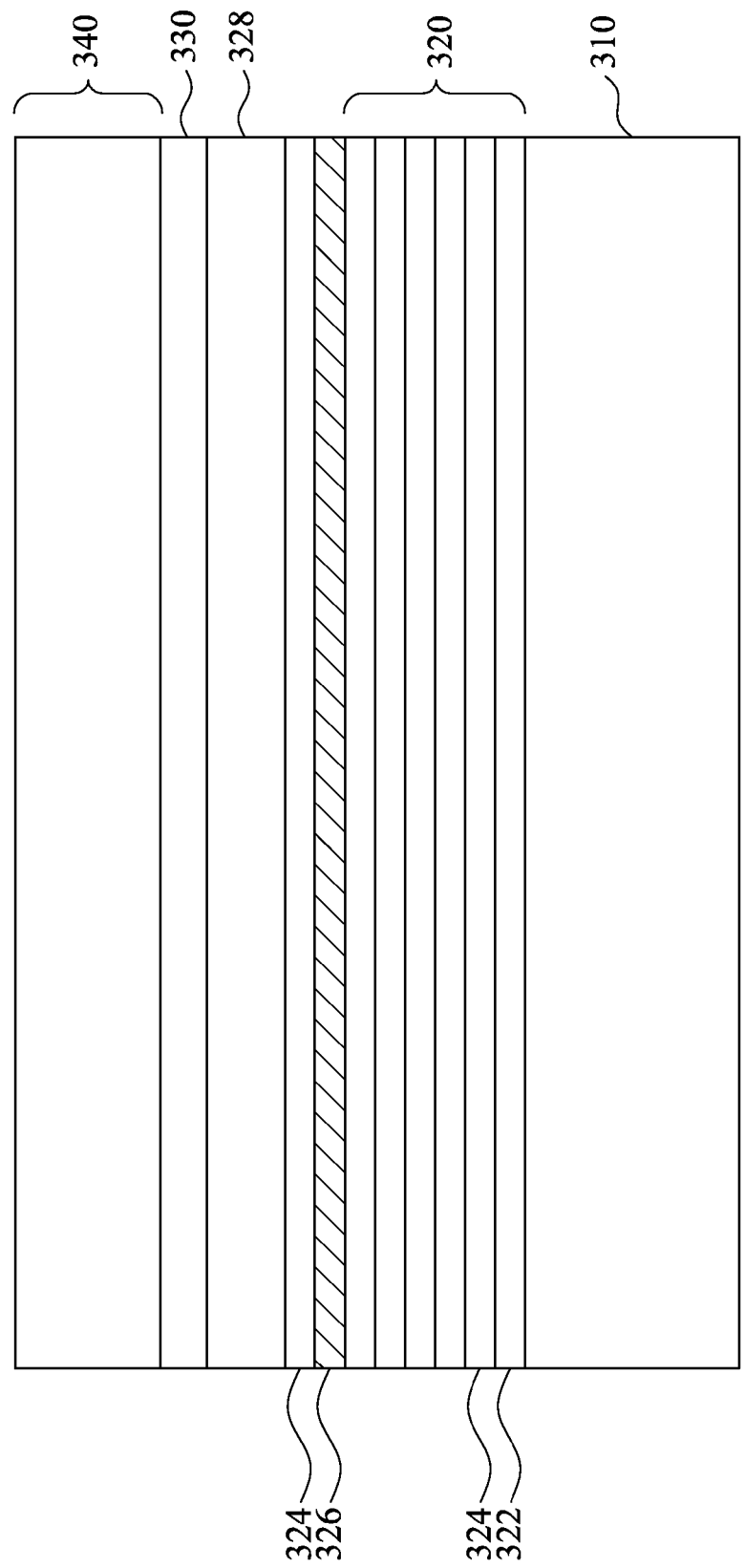
FIG. 3D are diagrammatic cross-sectional side views of the EUV mask of FIG. 2A at various stages of fabrication according to various embodiments of the present disclosure.

Referring to FIG. 3D, an absorber layer 340 is formed over the buffer layer 330 or the capping layer 328 according to various embodiments of the present disclosure. In embodiments, the absorber layer 340 has a total thickness d raging from 30-70 nm. The absorber layer 340 may be deposited by RF sputtering, DC sputtering, ion beam deposition (IBD) or atomic layer chemical vapor deposition (ALD). In various embodiments, shown in FIG. 3D, the absorber layer 340 is a dual-layer stack including a first layer 342 and a second layer 344 [not shown in FIG. 3D] made of highly absorptive materials to the radiation of wavelength at 13.5 nm. Patterning the absorber layer 340 includes forming a photoresist pattern over the absorber layer 340 in an absorption region, etching the absorber layer 340 by using the photoresist pattern as an etch mask to form an absorber pattern, and removing the photoresist pattern. In particular, the absorber layer 340 may be covered with a radiation-sensitive layer, such as photoresist, that is coated, exposed, and developed with a desired pattern. The photoresist pattern has a thickness of about 160-640 nm. As desired, a chemically-amplified resist (CAR) may be used. Depending on the photoresist pattern used, exposure is performed on an electron beam (e-beam) writer or a laser writer. Reactive ion etch may be used. For example, an absorber layer 340 may be dry etched with a gas that contains chlorine, such as Cl$_2$ or BCl$_3$, or with a gas that contains fluorine, such as NF$_3$. Argon (Ar) may be used as a carrier gas. In some cases, oxygen (O$_2$) may also be included as carrier. The etch rate and the etch selectivity depend on the etchant gas, etchant flow rate, power, pressure, and substrate temperature. The buffer layer 330 may serve as an etch stop layer to help achieve a good etch profile in the overlying absorber layer 340. The buffer layer 330 protects the underlying reflective ML coating 320 from damage during etch of the absorber layer 340.

Figure 4:
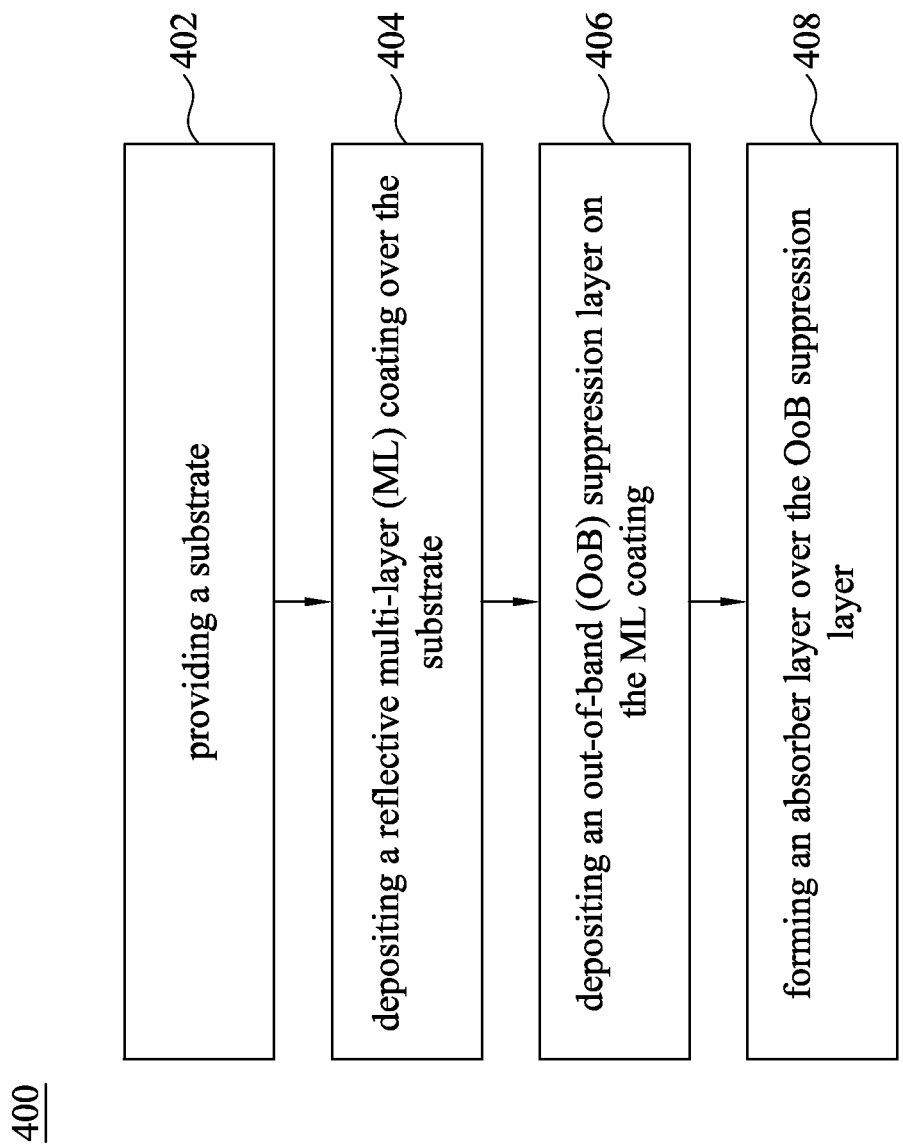
FIG. 4 is a flowchart illustrating a method of fabricating an EUV mask according to various embodiments of the present disclosure.

FIG. 4 is a flowchart illustrating a method of fabricating a method of fabricating an EUV mask according to various embodiments of the present disclosure. The operations are explained in the cross-sectional side views of a portion of the EUV mask 200 from FIGS. 3A to 3D at various fabrication stages according to various embodiments of the present disclosure. It is understood that FIGS. 3A-3D have been simplified for a better understanding of the inventive concepts of the present disclosure.

In FIG. 3A, a substrate 310 is provided in operation 402. Referring to FIG. 3A, the substrate 310 is made of a material having a low coefficient of thermal expansion (CTE). For example, the substrate 310 may be formed of β-quartz.

Referring to the operation 404, a reflective ML coating 320 is deposited over the substrate 310. In FIG. 3B, the reflective ML coating 320 has about 30-60 pairs of alternating layers of a low index of refraction material 322 and a high index of refraction material 324. In embodiments, the reflective ML coating 320 has 40 pairs of the alternative layers 322/324.

As various embodiments, in fabricating an EUV mask, a substrate 310 may be provided having the reflective ML coating 320 thereon. In this case of the substrate 310 with the reflective ML coating 320, the operation 404 in FIG. 4 may be omitted in the method of fabricating the EUV mask according to the embodiments of the present disclosure.

In embodiments, the method of fabricating the EUV mask further includes an operation 406 of depositing an OoB suppression layer on the ML coating in FIG. 4. Referring to FIG. 3C, the OoB suppression layer consists of a first layer 326 and a second layer 324. In embodiments, the first layer 326 is made of a material having a low reflectivity of the radiation at wavelength of 193-257 nm, and a low refraction index than that of the material for the second layer 324. In embodiments, the first layer 326 may be made of SiC and the second layer 324 be made of Mo. Accordingly, the OoB layer exhibit a reduced OoB light in view of 13.5 nm and an improved optical contrast as far as the radiation at 193-257 nm wavelength is concerned.

Still referring to FIG. 3C, in embodiments, a capping layer 328 made of SiC may be deposited on the OoB suppression layer 324/326. Because the Mo layer in either the reflective ML coating 320 or the OoB suppression layer can be oxidized under ambient conditions, the capping layer 328 of SiC prevents oxidation of the Mo layer. In embodiments, the capping layer 328 of SiC has a thickness of 2-7 nm, and for example, a thickness of 3 nm. In various embodiments, a buffer layer 330 is formed over the OoB suppression layer 324/326 or the capping layer 328, The buffer layer 330 may have a thickness of about 20-60 nm. The buffer layer may be formed from silicon dioxide ($SiO_2$) or a silicon (Si) layer. In various embodiments, the buffer layer may a Ru capping layer formed at the top of the ML coating 320 to prevent oxidation of Mo by exposure to the environment. The buffer layer 330 may be low temperature oxide (LTO) as $SiO_2$, or other materials, such as silicon oxynitride ($SiOxNy$) or carbon (C). The buffer layer 330 may act later as an etch stop layer for patterning of the overlying absorber 340 formed in the following operation. In embodiments, the capping 3 of SiC may be the buffer layer 330; that is, the buffer layer 330 is the same layer of the capping layer 328 of SIC and acts as the capping layer.

Referring to the operation 408 of FIG. 4, the absorber layer 340 is formed on the top surface of the OoB suppression layer. In various embodiments, the absorber 340 may be formed on the buffer layer 330 or the capping layer 328. The desired pattern on an EUV mask is defined by selectively removing an absorber layer to uncover portions of an underlying mirror coated on a substrate. According to various embodiments of the present disclosure, the method of fabricating the EUV mask further includes an operation of forming a resist layer over the absorber layer, patterning the resist layer to form a trench with a trench width, and etching through the absorber layer 340 to expose the reflective ML coating and removing the resist layer. As a result, the patterned absorber layer 340 of FIG. 2 is formed accordingly.

Figure 5:
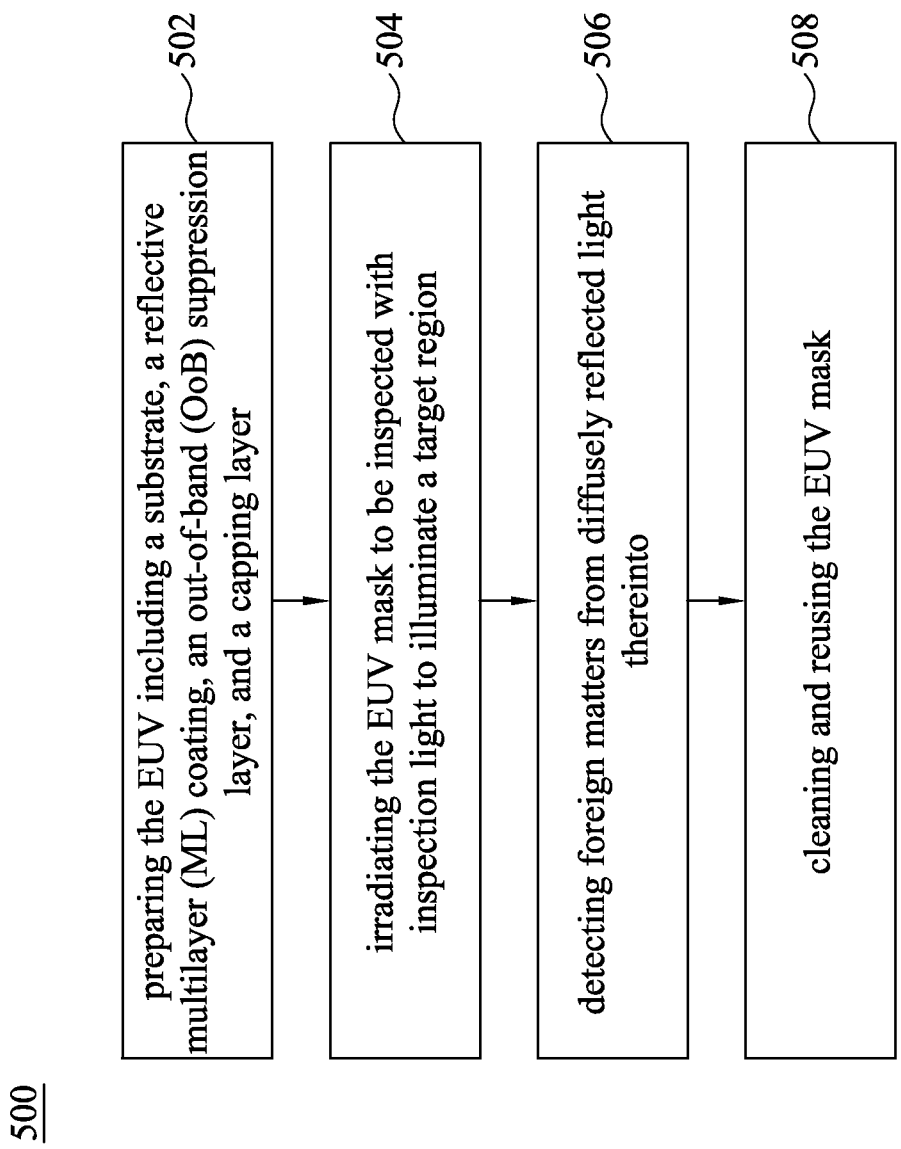
FIG. 5 is a flowchart illustrating a method of inspecting an EUV mask according to various embodiments of the present disclosure.

FIG. 5 is a flowchart illustrating a method of inspecting an EUV mask according to various embodiments of the present disclosure. In operation 502, the EUV mask is provided with a substrate, a reflective multilayer (ML) coating over the substrate, an out-of-band (OoB) suppression layer made of, for example, a pair of Mo and SiC layers on the reflective ML coating, and a capping layer made of SiC on the OoB suppression layer. In operation 504, the EUV mask is radiated with, for example, a wavelength of 193 nm, for inspection of a target region. In operation 506, foreign matters are detected from diffusely reflected light. Further, the EUV mask is cleaned at suitable process to be reused for the next EUV lithography process.

According to various embodiments, a contrast of the inspection light at wavelength of 193 nm is in a range of 0.65-0.90. In embodiments, wherein the EUV mask is an attenuated Phase Shift Mask (att-PSM). [This is a fragment. What are you trying to say?] With the method of inspecting the EUV mask according to the embodiments of the present disclosure, the EUV mask including the OoB suppression layer also has an improved optical contrast at a radiation of wavelength at 193 nm. Because of the enhanced optical contrast at wavelength at 193 nm, the EUV mask having an OoB suppression layer can be inspected with better detecting efficacy of the defects on or in the EUV mask. Further, the OoB suppression layer of SiC has a better resistance than the conventional materials (e.g., Si) to attacks of the chemicals used in the EUV lithography process or the cleaning process.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An extreme ultraviolet (EUV) mask, comprising:
   a substrate;
   a reflective multilayer (ML) coating over the substrate;
   an out-of-band (OoB) suppression layer on the reflective ML coating; and
   an absorber layer over the OoB suppression layer,
   wherein the reflective ML coating is made of alternating layers of molybdenum (Mo) and silicon (Si), wherein the number of the alternating layers is in a range from about 30 pairs to about 60 pairs, and the OoB suppression layer is made of at least a pair of Mo and silicon carbide (SiC) layers.

2. The EUV mask of claim 1, wherein the absorber layer is made of a material selected from the group consisting of TaBN, TaN and CrN.

3. The EUV mask of claim 1, further comprising a buffer layer between the OoB suppression layer and the absorber layer, wherein the buffer layer acts as a capping layer.

4. The EUV mask of claim 3, wherein the buffer layer is made of SiC.

5. The EUV mask of claim 3, wherein the buffer layer is made of a material selected from the group consisting of silicon dioxide ($SiO_2$), silicon oxynitride (SiON), carbon (C), and ruthenium (Ru).

6. The EUV mask of claim 4, wherein the buffer layer of SiC has a thickness between 2 to 5 nm.

7. The EUV mask of claim 5, wherein the substrate is made of a low thermal expansion material.

8. The EUV mask of claim 7, wherein the substrate is made of quartz.

9. The EUV mask of claim 1, wherein the absorber layer comprises at least one etch opening through which the reflective ML coating is exposed.

10. A method of fabricating an extreme ultraviolet (EUV) mask comprising:
    providing a substrate;
    depositing a reflective multi-layer (ML) coating over the substrate, wherein the reflective ML coating is made of alternating layers of molybdenum (Mo) and silicon (Si), wherein the number of the alternating layers is in a range from about 30 pairs to about 60 pairs;
    depositing an out-of-band (OoB) suppression layer on the reflective ML coating, wherein the OOB suppression layer is made of at least a pair of Mo and silicon carbide (SiC) layers; and
    forming an absorber layer over the OoB suppression layer.

11. The method of claim 10 further comprising forming a buffer layer over the OoB suppression layer before forming the absorber layer, and the buffer layer acts as a capping layer.

12. The method of claim 11, wherein forming the buffer layer is forming the buffer layer of SiC.

13. The method of claim 12, wherein the buffer layer of SiC has a thickness between 2 to 5 nm.

14. The method of claim 10, further comprising:
   forming a resist layer over the absorber layer, and patterning the resist layer to form a trench with a trench width;
   etching through the absorber layer,
   etching through the buffer layer to expose the OoB suppression layer; and
   removing the resist layer.

15. The method of claim 14, wherein etching through the absorber layer and the buffer layer comprise introducing a chlorine plasma, an oxygen plasma, or both of the chlorine and oxygen plasma.

16. The method of claim 10, forming the absorber layer is forming the absorber layer with a material selected from the group consisting of TaBN, TaN and CrN.

17. The method of claim 10, depositing the buffer layer is depositing the buffer with a material selected from the group consisting of silicon dioxide (SiO$_2$), silicon oxynitride (SiON), carbon (C), and ruthenium (Ru).

18. A method of inspecting an EUV mask, comprising:
   providing the EUV mask including a substrate, a reflective multilayer (ML) coating over the substrate, an out-of-band (OoB) suppression layer made of a pair of Mo and SiC layers on the reflective ML coating, and a capping layer made of SiC on the OoB suppression layer;
   irradiating the EUV mask to be inspected with inspection light to illuminate a target region;
   detecting foreign matters from diffusely reflected light; and
   cleaning and reusing the EUV mask.

19. The method of claim 18, wherein a contrast of the inspection light at wavelength of 193 nm is in a range of 0.65-0.90.

20. The method of claim 18, wherein the EUV mask is an attenuated Phase Shift Mask (att-PSM).

* * * * *